United States Patent
Huang et al.

(10) Patent No.: US 11,855,010 B2
(45) Date of Patent: Dec. 26, 2023

(54) SEMICONDUCTOR STRUCTURE AND METHOD FOR FORMING FEATURES IN REDUNDANT REGION OF DOUBLE SEAL RING

(71) Applicant: Taiwan Semiconductor Manufacturing Company, Ltd., Hsinchu (TW)

(72) Inventors: Shan-Yu Huang, Zhubei (TW); Shih-Chang Chen, Hsinchu (TW); Hsiao-Wen Chung, Taipei (TW); Yilun Chen, Hsinchu (TW); Huang-Sheng Lin, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 21 days.

(21) Appl. No.: 17/395,555

(22) Filed: Aug. 6, 2021

(65) Prior Publication Data
US 2023/0041160 A1 Feb. 9, 2023

(51) Int. Cl.
| | |
|---|---|
| *H01L 23/58* | (2006.01) |
| *H01L 23/00* | (2006.01) |
| *H01L 21/78* | (2006.01) |
| *H01L 27/12* | (2006.01) |
| *H01L 23/528* | (2006.01) |
| *H01L 27/088* | (2006.01) |

(52) U.S. Cl.
CPC ............ *H01L 23/585* (2013.01); *H01L 21/78* (2013.01); *H01L 23/562* (2013.01); *H01L 23/528* (2013.01); *H01L 27/0886* (2013.01); *H01L 27/1211* (2013.01)

(58) Field of Classification Search
CPC ..... H01L 23/10; H01L 23/31; H01L 23/3107; H01L 23/3142; H01L 23/5226; H01L 23/562; H01L 23/564; H01L 23/58; H01L 23/585; H01L 23/60; H01L 23/62; H01L 21/78; H01L 23/528; H01L 27/0886; H01L 27/1211
See application file for complete search history.

(56) References Cited

U.S. PATENT DOCUMENTS

| | | | |
|---|---|---|---|
| 2015/0194455 A1* | 7/2015 | Ho ................... | H01L 27/14634 438/109 |
| 2016/0013138 A1* | 1/2016 | Chen .................. | H01L 23/585 257/774 |
| 2022/0310464 A1* | 9/2022 | Huang ................ | H01L 23/585 |

* cited by examiner

*Primary Examiner* — Thanh T Nguyen
(74) *Attorney, Agent, or Firm* — McClure, Qualey & Rodack, LLP (57) ABSTRACT

A semiconductor structure is provided. The semiconductor structure includes two circuit regions, two inner seal rings, an outer seal ring, a first redundant region, and an electrical circuit. Each of the inner seal rings surrounding one of the circuit regions. The outer seal ring is disposed around the inner seal rings, and each of the inner seal rings contacts the outer seal ring at different interior corners of the outer seal ring. The first redundant region is located between at least one of the inner seal rings and the outer seal ring. The electrical circuit is formed in the first redundant region and electrically connected to at least one of the circuit regions.

20 Claims, 10 Drawing Sheets

SEMICONDUCTOR STRUCTURE AND METHOD FOR FORMING FEATURES IN REDUNDANT REGION OF DOUBLE SEAL RING

BACKGROUND

In semiconductor technologies, a semiconductor wafer is processed through various fabrication steps to form integrated circuits (IC). Typically, several circuits or IC dies are formed onto the same semiconductor wafer. The wafer is then diced to cut out the circuits formed thereon. To protect the circuits from moisture degradation, ionic contamination, and dicing processes, a seal ring is formed around each IC die. This seal ring is formed during fabrication of the many layers that comprise the circuits, including both the front-end-of-line (FEOL) processing and back-end-of-line processing (BEOL). The FEOL includes forming transistors, capacitors, diodes, and/or resistors onto the semiconductor substrate. The BEOL includes forming metal layer interconnects and vias that provide routing to the components of the FEOL.

Although existing seal ring structures and fabrication methods have been generally adequate for their intended purposes, improvements are desired. For example, it is desired to form certain seal rings to be fully closed or partially closed depending on chip architecture.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 6.0 nm, etc.

The present application generally relates to semiconductor structures and a method for forming the same, and more particularly to providing a seal ring structure that includes dual seal rings or double seal rings. The dual seal rings include an outer seal ring that is disposed around two or more inner seal rings. Each inner seal ring surrounds a circuit region (or an IC area or a chip area, for example). Certain regions of the inner seal rings may be selectively formed to be open or closed depending on chip architecture. For example, two circuit regions may be formed to have interconnects (wafer-level interconnects) between them, thereby resulting in connected dies, or they may be formed as separate, individual dies. In the former situation, the inner seal rings surrounding each circuit region are partially open to allow interconnects to go through. In the latter situation, the inner seal rings surrounding each circuit region are fully closed. In either case, the outer seal ring is fully closed. In the former situation, the wafer is diced (or cut) outside of the outer seal ring, and the outer seal ring provides fully enclosed protection to the connected dies. In the latter situation, the wafer is diced between the inner seal rings, the outer seal ring is also cut, and the inner seal rings provide fully enclosed protection to individual dies.

In some embodiments of the present disclosure, the outer and the inner seal rings have the same shape (for example, the exterior outline of the outer and the inner seal rings is rectangular or substantially rectangular). In some embodiments, the inner seal rings may be selectively open or closed. Further, four corner seal ring (CSR) structures are formed at the four interior corners of each of the inner and the outer seal rings. In some embodiments, the CSR structures are triangular shaped for various mechanical concerns for enhancing the protection. The regions between the inner seal rings and the outer seal ring may be inherently formed, such as about 30 µm to 40 µm wide. These regions may be referred to as redundant regions since they are formed apart from the circuit regions. Similarly, a redundant region also exists between the inner seal rings. In the present disclosure, electrical circuits are selectively formed in those redundant regions to make better use of the redundant regions. The electrical circuits are inserted at one or more layers of a wafer. For example, the electrical circuits may be inserted at one or more of diffusion layer, fin layer (for FinFETs), gate layer, contact layer, via layers, and metal layers (i.e., interconnect wiring layers). In some embodiments, the electrical circuits are inserted at each layer from the fin layer to the topmost metal layer. Those skilled in the art should appreciate that they may readily use the present disclosure as a basis for designing the electrical circuits or modifying other processes and structures for carrying out the same purposes and/or achieving the same advantages of the embodiments introduced herein.

Figure 1A:
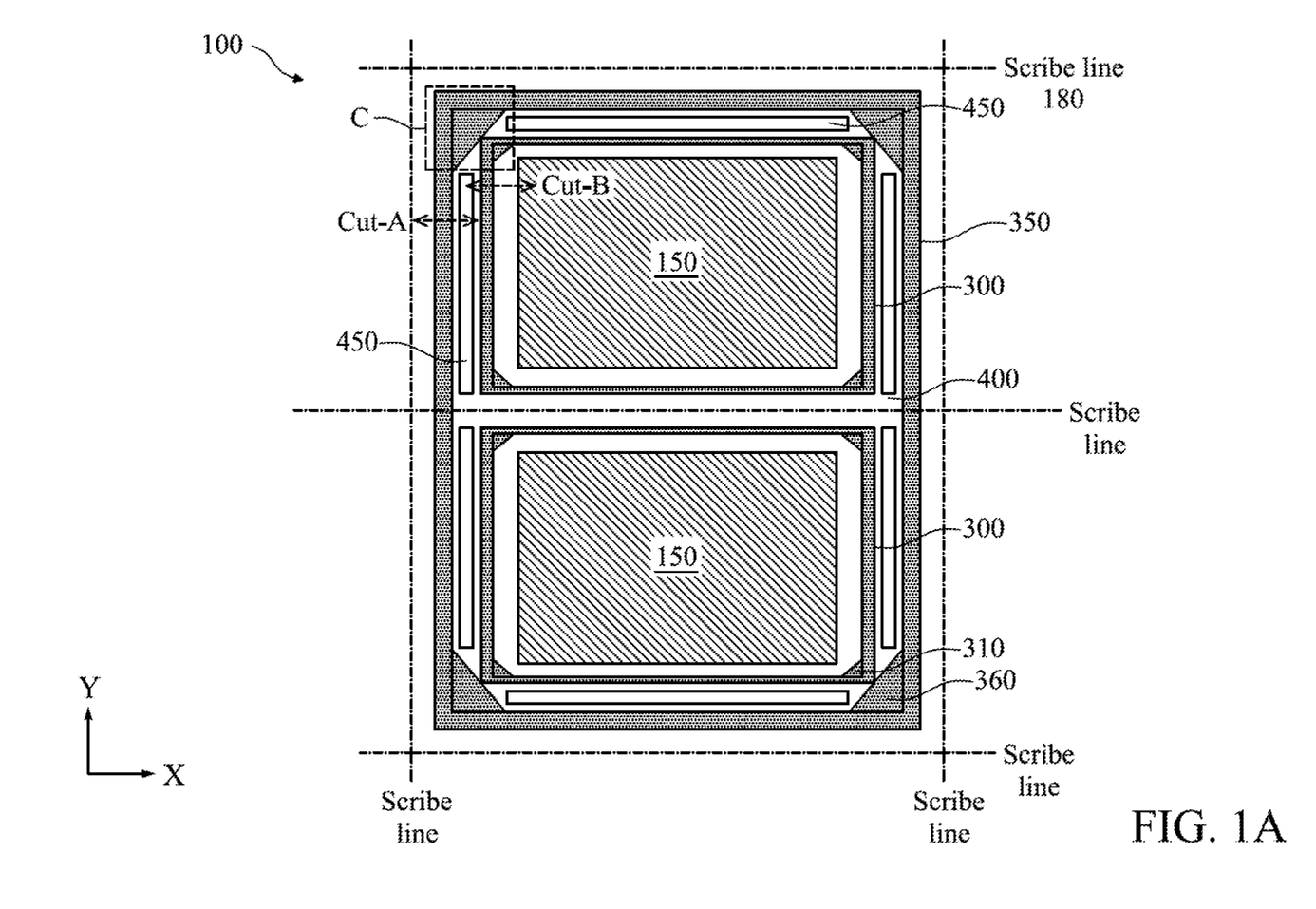
FIG. 1A and FIG. 1B are top plan views of a semiconductor structure with multiple circuit regions and multiple seal rings with (FIG. 1A) and without (FIG. 1B) showing electrical circuits in redundant regions in accordance with some embodiments of the present disclosure.
Figure 1B:
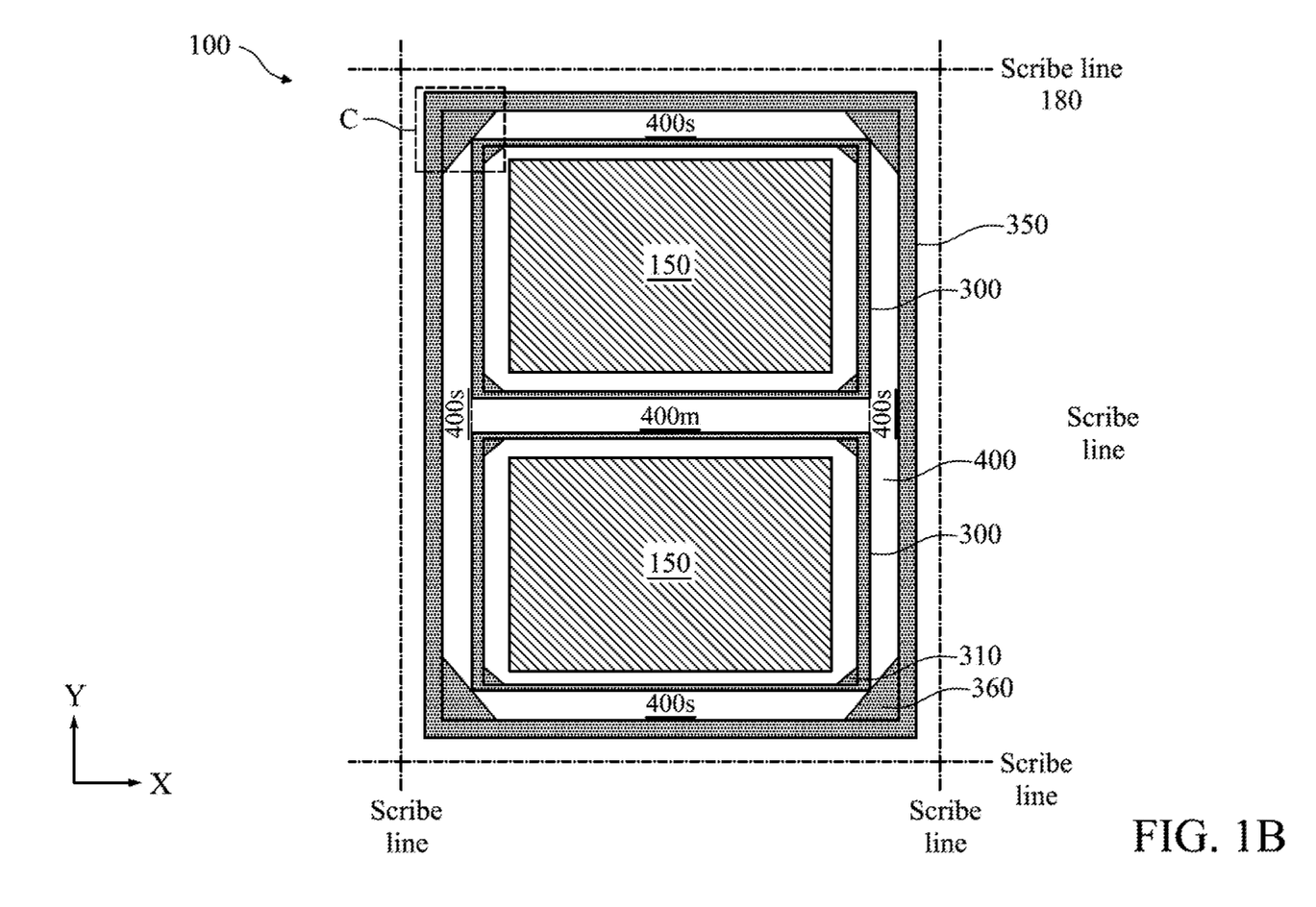

FIG. 1A is a top plan view of a semiconductor structure (or semiconductor device) 100 with electrical circuits 450 in redundant regions 400 in accordance with some embodiments of the present disclosure. FIG. 1B is a top plan view of the semiconductor structure 100 of FIG. 1A without showing the electrical circuits 450 so that the redundant regions 400 (which includes redundant regions 400s and 400m) may be more clearly viewed.

Referring to FIGS. 1A and 1B collectively, the semiconductor structure 100 (such as a manufactured wafer or a part thereof) includes an outer seal ring 350 that encloses (or surrounds) multiple inner seal rings 300. Each inner seal ring 300 encloses a circuit region (or IC die) 150. The embodiment depicted in FIGS. 1A-1B shows two inner seal rings 300 enclosing two circuit regions 150. In other embodiments (not shown), the outer seal ring 350 may be disposed around more than two inner seal rings 300 and more than two circuit regions 150. In some embodiments, each circuit region 150 may perform the same function. For example, each circuit region 150 may be a memory chip or a processor chip. In some embodiments, the circuit regions 150 may perform different functions. For example, one circuit region 150 may be a transmitter chip (such as a wireless transmitter) and another circuit region 150 may be a receiver chip (such as a wireless receiver). In the embodiment depicted in FIG. 1A, each circuit region 150 is produced as an individual die or chip. For example, the semiconductor structure 100 is diced (or cut) along scribe lines 180 as illustrated in FIG. 1A. As a result, the outer seal ring 350 is also cut. The inner seal rings 300 stay intact during the dicing process and provide sealing and protective functions to each individual circuit region 150 (also referred to as individual dies 150 for this embodiment).

Figure 2:
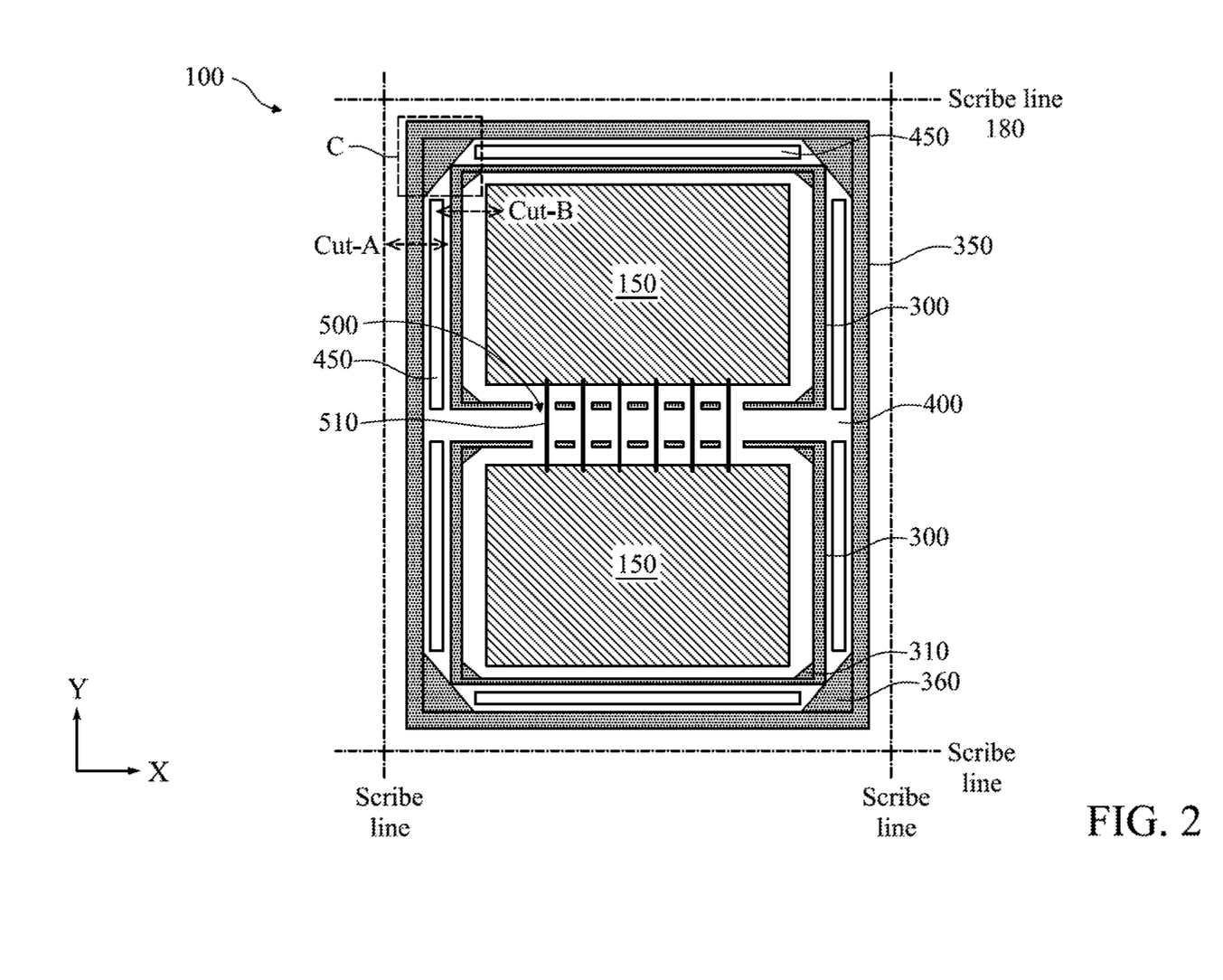
FIG. 2 is a top plan view of a semiconductor structure where inner seal rings are selectively opened, and interconnects are selectively formed between circuit regions in accordance with some embodiments of the present disclosure.

FIG. 2 is a variant of the embodiment shown in FIGS. 1A-1B where inner seal rings 300 are formed with openings 500 at selective locations and interconnects 510 (which are conductors) are formed to connect multiple circuit regions 150 through the openings 500. The interconnects 510 are wafer-level (or die-level) interconnects, which advantageously have reduced resistance and better noise immunity than some off-chip interconnects. The interconnected circuit regions 150 (also referred to as connected dies 150 for the present embodiment) form a larger system (or a system-on-wafer). In such embodiments, the semiconductor structure 100 is diced (or cut) along scribe lines 180 that are outside of the outer seal ring 350 as shown in FIG. 2. Thus, the outer seal ring 350 provides sealing and protective functions to the connected dies 150.

In some embodiments, the set of masks that are used to form the semiconductor structure 100 shown in FIG. 1A and the set of masks that are used to form the semiconductor structure 100 shown in FIG. 2 share some common masks. A mask is also referred to as a photo mask or photomask and is used to perform photolithography on semiconductor wafers to form features of the semiconductor structure 100. For example, the sets of masks that are used to form the semiconductor structures 100 shown in FIG. 1A and FIG. 2 may share common masks for some of the diffusion layer, fin layer (for FinFETs), gate layer, contact layer, via layers, and metal layers. The fin layer refers to a semiconductor layer where semiconductor fins for FinFETs are formed protruding over a semiconductor substrate (such as a silicon substrate). The above sets of masks may differ in those layers where the interconnects 510 are formed, such as some metal layers, particularly high-level metal layers, such as the fifth metal (M5) layer, the sixth metal (M6) layer, and/or other metal layers. By sharing masks between the above sets of masks, a manufacturer may selectively produce individual dies 150, connected dies 150, or both, with reduced total costs. For example, if each of the above sets of masks has N masks, the manufacturer may just need to produce M common masks, N1 masks specifically for one of the set of masks, and N2 masks specifically for the other set of masks, where M+N1+N2 is less than 2N. The less number of masks produced, the less costs to the manufacturer. The individual dies 150 and the connected dies 150 may satisfy different market demands.

The outer seal rings 350 in the embodiments shown in FIG. 1A and in FIG. 2 are the same. The inner seal rings 300 in the embodiments shown in FIG. 1A and in FIG. 2 are the same except those openings 500 in FIG. 2. Thus, for simplicity purposes, the description of the inner seal rings 300 and the outer seal ring 350 below applies to both embodiments, unless it is about the openings 500.

Referring FIG. 1B, the outer seal ring 350 has a rectangular or substantially rectangular periphery. In other words, the exterior outline (or exterior boundary) of the outer seal ring 350 is rectangular or substantially rectangular. The outer seal ring 350 further includes four corner seal ring (CSR) structures 360 at the four interior corners of the rectangular or substantially rectangular periphery. In some embodiments, the CSR structure 360 is triangular or substantially triangular. For example, the periphery of each CSR structure 360 is a right triangle or a right isosceles triangle. The legs of the triangle run parallel to the edges of the periphery of the outer seal ring 350, and the hypotenuse of the triangle is adjacent the inner seal rings 300. The CSR structures 360 provide various mechanical benefits to the outer seal ring 350, such as preventing layer peeling at the corner of the chips during dicing processes. With the CSR structures 360, the interior outline (or interior boundary) of the outer seal ring 350 is octagonal or substantially octagonal.

Still referring to FIG. 1B, each inner seal ring 300 has the same structure as the outer seal ring 350. In other words, each inner seal ring 300 has a rectangular or substantially rectangular periphery and has four CSR structures 310 at the four interior corners of the rectangular or substantially rectangular periphery. The interior outline (or interior boundary) of each inner seal ring 300 is octagonal or substantially octagonal. Using the same structure in both the inner seal rings 300 and the outer seal ring 350 advantageously reduces the manufacturer's time spent on qualifying different seal ring structures. In the present embodiment, the inner seal rings 300 are placed as close to the outer seal ring 350 as possible to reduce the total footprint of the structure. For example, the exterior corners of the inner seal rings 300 may be placed right next to (i.e., abutting or contacting) the hypotenuse of the CSR structures 360. With such placement, there are empty regions 400s (which may also be referred to as redundant regions 400s) between the inner seal rings 300 and the outer seal ring 350.

As shown in FIG. 1B, each redundant region 400s has a trapezoidal shape or a substantially trapezoidal shape. In a further embodiment, each redundant region 400s is an isosceles trapezoid with its legs being part of the hypotenuse of the CSR structures 360. In some embodiments, the height of the trapezoidal shape is in a range of about 30 µm to 40 µm, and the length of the trapezoidal shape is in a range of about 1 mm to 26 mm for the top and bottom redundant regions 400s and about 2 mm to about 66 mm for the left and right redundant regions 400s. The height of the trapezoidal shape is the dimension along "Y" direction for the top and bottom redundant regions 400s and the dimension along "X" direction for the left and right redundant regions 400s. The length of the trapezoidal shape is the dimension along "X" direction for the top and bottom redundant regions 400s and the dimension along "Y" direction for the left and right redundant regions 400s.

Furthermore, the region between the inner seal rings 300 is also a redundant region 400m in some embodiments (such as the embodiment of FIG. 1A), while part of it becomes a circuit region in alternative embodiments (such as the embodiment of FIG. 2). The redundant region 400m is rectangular or substantially rectangular in an embodiment. In some embodiments, the redundant region 400m has a width (along "Y" direction) of about 60 µm to about 200 µm (such as about 65 µm to about 180 µm) and a length (along "X" direction) of about 1 mm to about 26 mm. In the following discussion, both the redundant regions 400s and the redundant region 400m are referred to as redundant regions 400.

Given the size of the redundant regions 400, it is highly desirable that they are utilized to provide benefits to the semiconductor structure 100. In the present embodiment, electrical circuits 450 are also formed into the redundant regions 400. Forming electrical circuits 450 into the redundant regions 400 advantageously raise the efficiency and performance of the semiconductor structure 100 since more electrical circuits may be formed. In the present embodiment, the electrical circuits 450 are formed across the redundant regions 400s. However, those skilled in the art may adjust the position of the electrical circuits 450 in the redundant regions 400s based on the functions or design to be achieved.

In the present embodiment, the electrical circuits 450 are shown as rectangular shapes (including long and/or short rectangles). However, the present disclosure is not limited thereto. In some embodiments, the electrical circuits 450 may be square shapes, other regular or irregular shapes. The shapes of the electrical circuits 450 may be uniform or non-uniform, which is not limited in the present disclosure. Further, the electrical circuits 450 may be of any size as long as they meet the design rules for the manufacturing process. It should be noted that the detailed structure of the electrical circuits 450 are not shown in detail since it may be adjustable depending on the demand of those skilled in the art. In some embodiments, the electrical circuits 450 may include a via layer and a metal layer above the via layer, and they may be vertically (i.e., into the page of FIG. 1A and FIG. 2) and electrically connected. In some embodiments, the electrical circuits 450 are present at each layer of the semiconductor structure 100 where protruding circuit features are present in the circuit regions 150. For example, the electrical circuits 450 may be present in at least one of the fin layer, the gate layer, the contact layer, the via layers, and the metal layers of the semiconductor structure 100.

Figure 3:
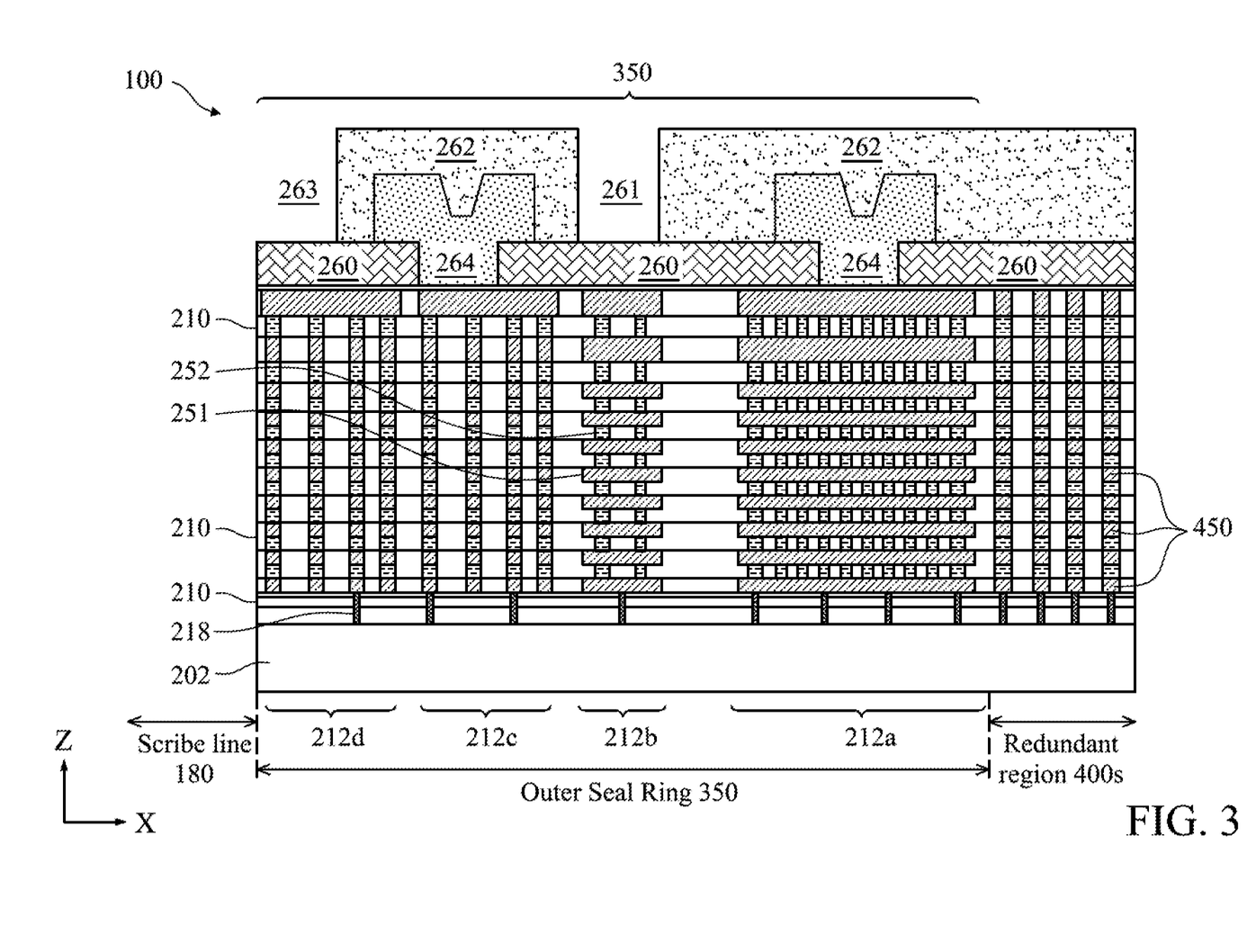
FIG. 3 is a cross-sectional view of a portion of the semiconductor structure shown in FIGS. 1A and 2 along the "Cut-A" line of FIGS. 1A and 2, in accordance with some embodiments of the present disclosure.

FIG. 3 shows a cross-sectional view of a portion of the semiconductor structure 100 along the "Cut-A" line of FIG. 1A, in accordance with some embodiments of the present disclosure. It is also a cross-sectional view of a portion of the semiconductor structure 100 along the "Cut-A" line of FIG. 2 because the embodiments shown in FIG. 1A and FIG. 2 are the same in this cross-sectional view. Referring to FIG. 3, the outer seal ring 350 includes multiple sub seal rings such as sub seal rings 212a, 212b, 212c, and 212d, which will be further discussed below. Further, as shown in FIG. 3, the electrical circuits 450 are present in the redundant region 400s.

Referring to FIG. 3, the semiconductor structure 100 includes a substrate 202. The substrate 202 is a silicon substrate in the present embodiment. The substrate 202 may alternatively include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. The substrate 202 may include doped active regions such as a P-well and/or an N-well 204 (see FIG. 7). The substrate 202 may also further include other features such as a buried layer, and/or an epitaxy layer. Furthermore, the substrate 202 may be a semiconductor on insulator such as silicon on insulator (SOI). In other embodiments, the substrate 202 may include a doped epitaxy layer, a gradient semiconductor layer, and/or may further include a semiconductor layer overlying another semiconductor layer of a different type such as a silicon layer on a silicon germanium layer. The substrate 202 includes active regions (such as N+ or P+ doped regions) that are configured as an NMOS device (e.g., nFET) or a PMOS device (e.g., pFET). The substrate 202 may include underlying layers, devices, junctions, and other features (not shown). In some embodiments, the outer seal ring 350, the inner seal rings 300, the redundant regions 400 along with the electrical circuits 450, and the circuit regions 150 are built in or on the substrate 202 simultaneously via a series of processes. The substrate 202 further includes an assembly isolation 170 (FIG. 4) between the inner seal rings 300 and the circuit regions 150 and scribe line regions (for scribe lines 180) surrounding the outer seal ring 350 and optionally going through the outer seal ring 350.

The outer seal ring 350 includes the sub seal rings 212a, 212b, 212c, and 212d. The sub seal ring 212a is wider than the other sub seal rings, thus may be referred to as the main sub seal ring. Having multiple nested sub seal rings ensures that at least the inner sub seal ring(s) is/are protected from cracks during dicing (e.g., die sawing). For example, the sub seal rings 212c and 212d can protect the sub seal rings 212a and 212b from damages that may occur during dicing.

Each of the sub seal rings 212a, 212b, 212c, and 212d includes one or more conductive features 218 disposed on the substrate 202, such as disposed on active regions of the substrate 202. The conductive features 218 may include multiple conductors vertically stacked, and may include doped semiconductors, metals, conductive nitride, conductive oxide, or other types of conductive materials. Over the conductive features 218, each of the sub seal rings 212a, 212b, 212c, and 212d further includes multiple metal layers 251 stacked one over another and vertically connected by metal vias 252. Metal layers 251 and metal vias 252 may comprise copper, copper alloys, or other conductive materials and may be formed using damascene or dual damascene processes. Each of the metal layers 251 and the metal vias 252 may include a conductive barrier layer (such as TiN or TaN) surrounding a metal core (such as copper). In some embodiments, each of the metal layers 251 is formed into a ring or a ring-like structure (such as a substantially square ring) that surrounds the inner seal rings 300 and the circuit regions 150. In other words, each of the metal layers 251 is formed into a closed structure and extends along the edges of the area occupied by the inner seal rings 300 and the circuit regions 150.

In the present embodiment, a ring or a ring-like structure refers to a closed structure, which may be rectangular, square, substantially rectangular, substantially square, or in other polygonal shapes. In some embodiments, the outer vias 252 (the vias 252 that are the closest and the furthest, respectively, from the inner seal rings 300 and the circuit regions 150) are formed into the shape of a ring. Thus, they are also referred to as via bars. The inner vias 252 are formed into discrete vias that form a line parallel to the outer vias 252. In the present embodiment, each of the sub seal rings 212a and 212c further includes an aluminum pad 264.

The conductive features 218, the metal layers 251, and the metal vias 252 are embedded in dielectric layers 210. The dielectric layers 210 may include silicon oxide, silicon nitride, silicon oxynitride, low-k dielectric materials, extreme low-k (ELK) dielectric materials, or other suitable dielectric materials (for example, including silicon, oxygen, nitrogen, carbon, or other suitable isolation constituent), or combinations thereof. The semiconductor structure 100 further includes a passivation layer 260 over the dielectric layers 210 and another passivation layer 262 over the passivation layer 260. Each of the aluminum pads 264 includes a top portion that is disposed over the passivation layer 260 and a bottom portion that penetrates the passivation layer 260 and electrically connects to the sub seal rings 212a and 212c. In some embodiments, each of the aluminum pads 264 is formed into a shape of a ring that surrounds the inner seal rings 300 and the circuit regions 150. Thus, the aluminum pads 264 may also be referred to as aluminum rings 264. Aluminum pads 264 may be formed simultaneously with the formation of bond pads (not shown) that are exposed on the top surface of circuit regions 150. The passivation layer 262 is disposed over the passivation layer 260 and the aluminum pads 264. Passivation layers 260 and 262 may be formed of oxides, nitrides, and combinations thereof, and may be formed of the same or different materials.

A trench 261 is provided in the passivation layer 262 above the sub seal ring 212b. Another trench 263 is provided in the passivation layer 262 above the sub seal ring 212d. In some embodiments, each of the trenches 261 and 263 is formed into a shape of a ring surrounding the inner seal rings 300 and the circuit regions 150. An advantageous feature of the dual trenches 261, 263 is that if a crack occurs in the scribe line during dicing, the crack will be stopped by the trench 263. Even if the crack propagates across the trench 263, if at all, the stress of the crack is substantially reduced by the trench 261. The semiconductor structure 100 may include other features and layers not shown in FIG. 3.

As shown in FIG. 3, the electrical circuits 450 are formed at each layer where there are features (or conductive features) in the outer seal ring 350. In some embodiments, the electrical circuits 450 are formed by the same processes or materials as the outer seal ring 350. However, the present disclosure is not limited thereto.

Figure 4:
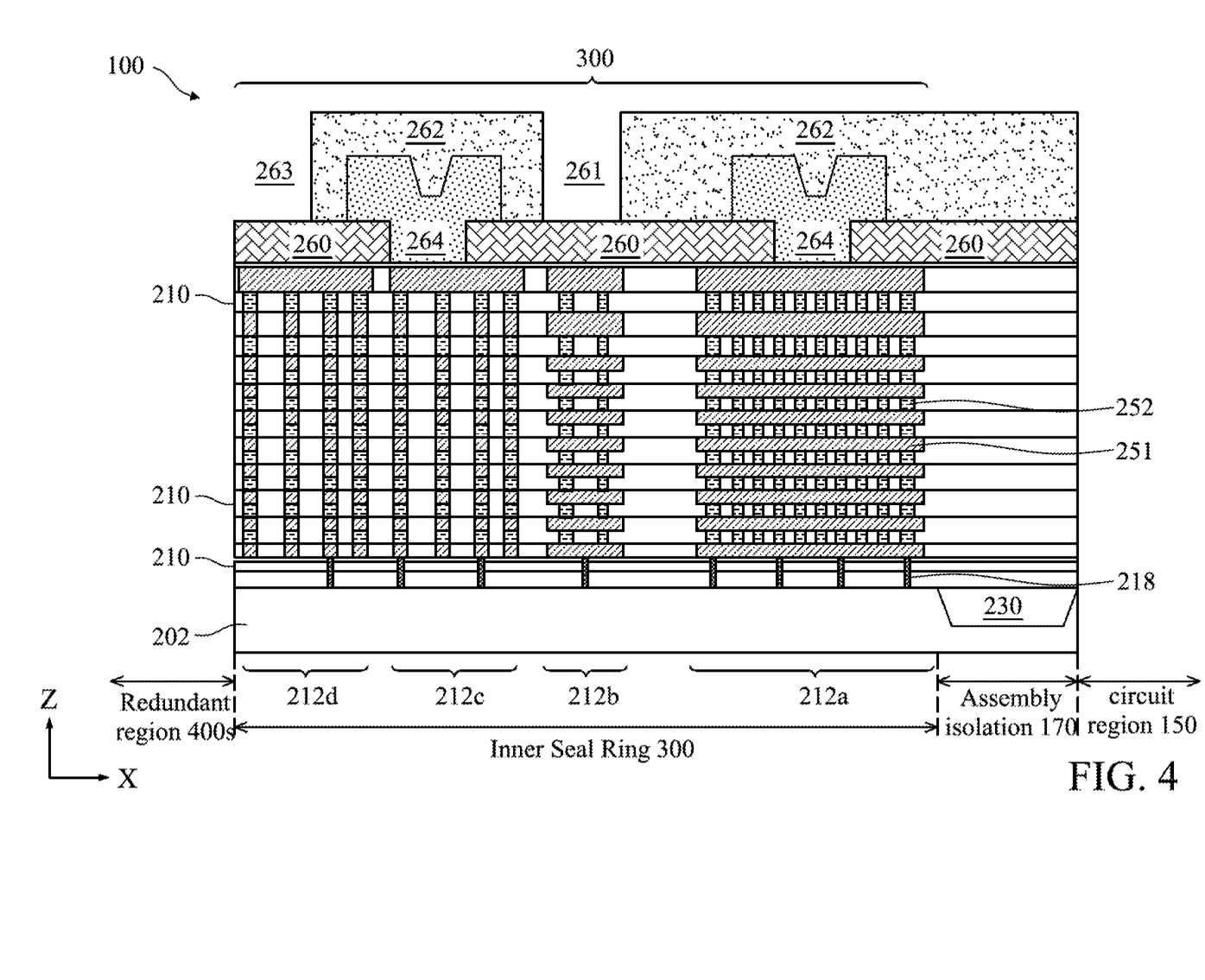
FIG. 4 is a cross-sectional view of a portion of the semiconductor structure shown in FIGS. 1A and 2 along the "Cut-B" line of FIGS. 1A and 2, in accordance with some embodiments of the present disclosure.

FIG. 4 shows a cross-sectional view of a portion of the semiconductor structure 100 along the "Cut-B" line of FIG. 1A, in accordance with some embodiments of the present disclosure. It is also a cross-sectional view of a portion of the semiconductor structure 100 along the "Cut-B" line of FIG. 2 because the embodiments shown in FIG. 1A and FIG. 2 are the same in this cross-sectional view. Referring to FIG. 4, similar to the outer seal ring 350, the inner seal ring 300 also includes multiple sub seal rings such as sub seal rings 212a, 212b, 212c, and 212d. The features of the inner seal ring 300 are the same as those of the outer seal ring 350, other than that, for example, the dimensions of the sub seal rings may be different between them.

The semiconductor structure 100 further includes an assembly isolation 170 between the inner seal ring 300 and the circuit region 150. The assembly isolation 170 includes an isolation structure (such as shallow trench isolation) 230. The isolation structure 230 may include silicon oxide, silicon nitride, silicon oxynitride, other suitable isolation material (for example, including silicon, oxygen, nitrogen, carbon, or other suitable isolation constituent), or combinations thereof. Isolation structure 230 can include different structures, such as shallow trench isolation (STI) structures and/or deep trench isolation (DTI) structures. In some embodiments, the semiconductor structure 100 may include various dummy lines and dummy vias in the assembly isolation 170.

Figure 5:
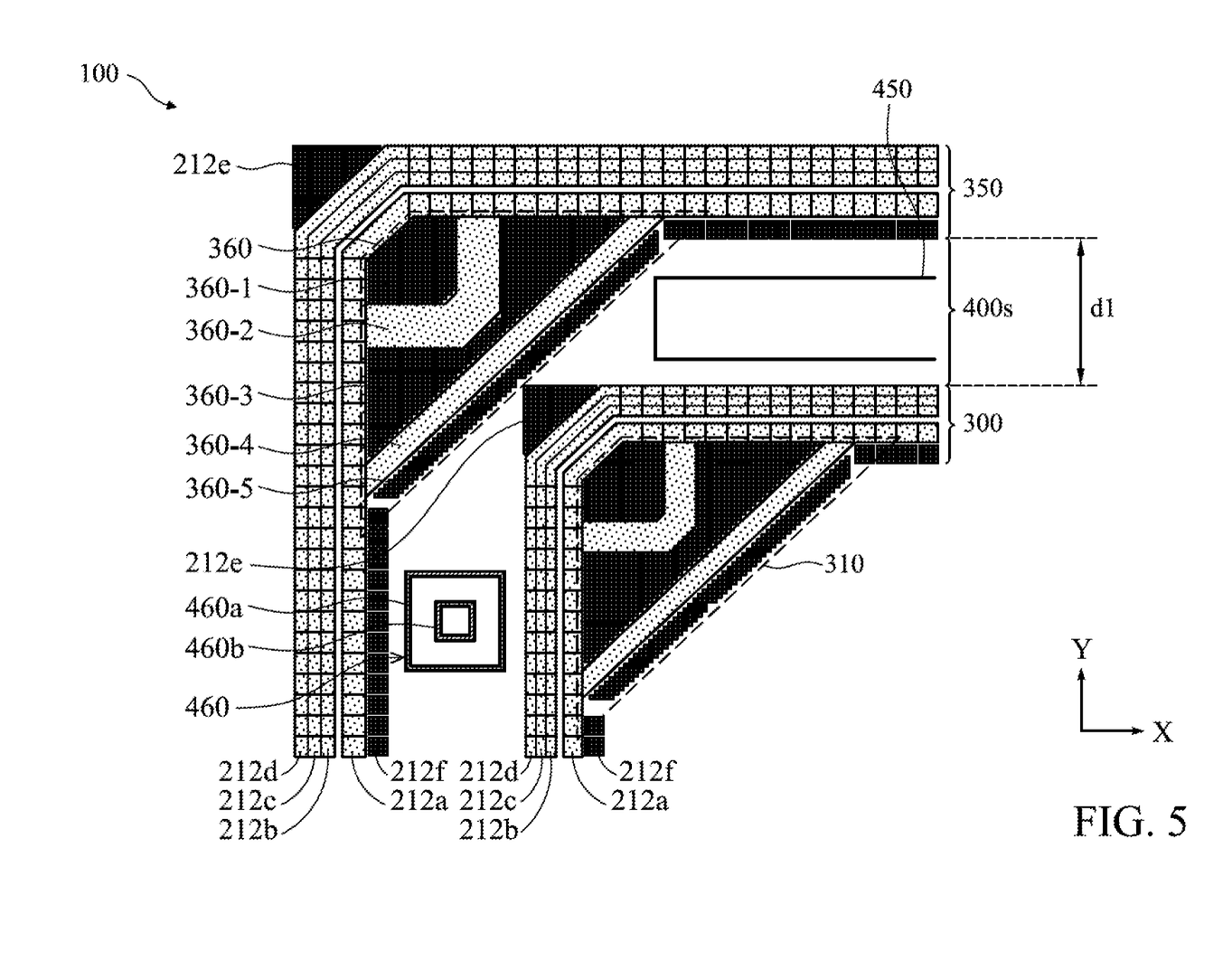
FIG. 5 is a closeup top plan view of the semiconductor structure shown in the area C in FIGS. 1A and 2 in accordance with some embodiments of the present disclosure.

FIG. 5 shows a closeup top plan view of the semiconductor structure 100 shown in the area C in FIGS. 1A and 2 in accordance with some embodiments of the present disclosure. Referring to FIG. 5, each of the outer seal ring 350 and the inner seal ring 300 includes the sub seal rings 212a, 212b, 212c, and 212d. The outer seal ring 350 includes an interior CSR structure 360. The inner seal ring 300 includes an interior CSR structure 310. Each of the outer seal ring 350 and the inner seal ring 300 further includes an exterior corner structure 212e which includes multiple discrete features that form a triangular or substantially triangular shape. For each sub seal ring 212a, 212b, 212c, and 212d, its top portion and side portion are connected by a sloped section. The exterior corner structure 212e is disposed next to the sloped section of the sub seal ring 212d. The exterior corner structure 212e and the top and side portions of the sub seal ring 212d form a right angle or an approximately right angle. To the interior of the sub seal ring 212a, each of the outer seal ring 350 and the inner seal ring 300 further includes an interior linear structure 212f that includes multiple discrete metal features that form a linear or substantially linear shape. The space from the interior linear structure 212f of the outer seal ring 350 to the sub seal ring 212d and the exterior corner structure 212e of the inner seal ring 300 is the redundant region 400s. The width d1 of the redundant region 400s is about 30 μm to about 40 μm in an embodiment. The CSR structure 360 includes multiple sections 360-1, 360-2, 360-3, 360-4, and 360-5. Each of the sections 360-1, 360-3, and 360-5 includes multiple discrete features. The section 360-2 is a long continuous feature that is "L" shaped. The section 360-4 is a long continuous linear feature. Both the sections 360-2 and 360-4 are connected to the sub seal ring 212a. The tip of the exterior corner structure 212e of the inner seal ring 300 abuts the section 360-5 of the CSR structure 360. The CSR structure 310 is similar in construction to the CSR structure 360.

In some embodiments, a pattern 460 may be formed in the redundant regions 400s. As shown in FIG. 5, the pattern 460 and the electrical circuit 450 are located on different sides of the redundant regions 400s. That is, the pattern 460 and the electrical circuit 450 are separated by the CSR structures 310 and 360. However, the present disclosure is not limited thereto. In some embodiments, the pattern 460 and the electrical circuit 450 may be located on the same side of the redundant regions 400s. In some embodiments, the pattern 460 and the electrical circuit 450 may be arbitrarily arranged in the redundant regions 400s, and the following description will not list all the arrangement of the pattern 460 and the electrical circuit 450.

In some embodiments, the pattern 460 may be disposed in the area C. In some embodiments, the pattern 460 may be located out of the area C. For example, the pattern 460 may also be arranged in other parts of the redundant regions 400s and/or in the redundant regions 400m. In some embodiments, the distribution density of the pattern 460 in the redundant region 400s is non-uniform across the redundant region 400s. That is, the pattern 460 may merely formed in a certain part of the redundant region 400s. Similarly, in some embodiments, the distribution density of the pattern 460 in the redundant region 400s is non-uniform across the redundant region 400s. In some embodiments, the pattern 460 includes a first section 460a and a second section 460b that is disposed around the first section 460a. The first section 460a and the second section 460b may be homocentric squares.

A measurement may be conducted between adjacent sides of the first section 460a and the second section 460b in the X direction or the Y direction, so that it may be determined whether any dimension error occurs in the semiconductor structure 100 based on the measurement result. For example, if the distance between the adjacent sides of the first section 460a and the second section 460b in the X direction is substantially the same as the distance between the adjacent sides of the first section 460a and the second section 460b in the Y direction, it would be determined that the semiconductor structure 100 substantially conforms to its original design. Otherwise, it would be determined that some error occurred during the manufacturing processes, and there is a deviation of the dimensions of the semiconductor structure 100. In some embodiments, the pattern 460 may have other shapes or structures (which will be discussed below in accompany with FIGS. 6A-6C, for example) and are configured for other functions. For example, the pattern 460 may be configured to position or align different layers or masks during the manufacturing processes of the semiconductor structure 100.

Figure 6A:
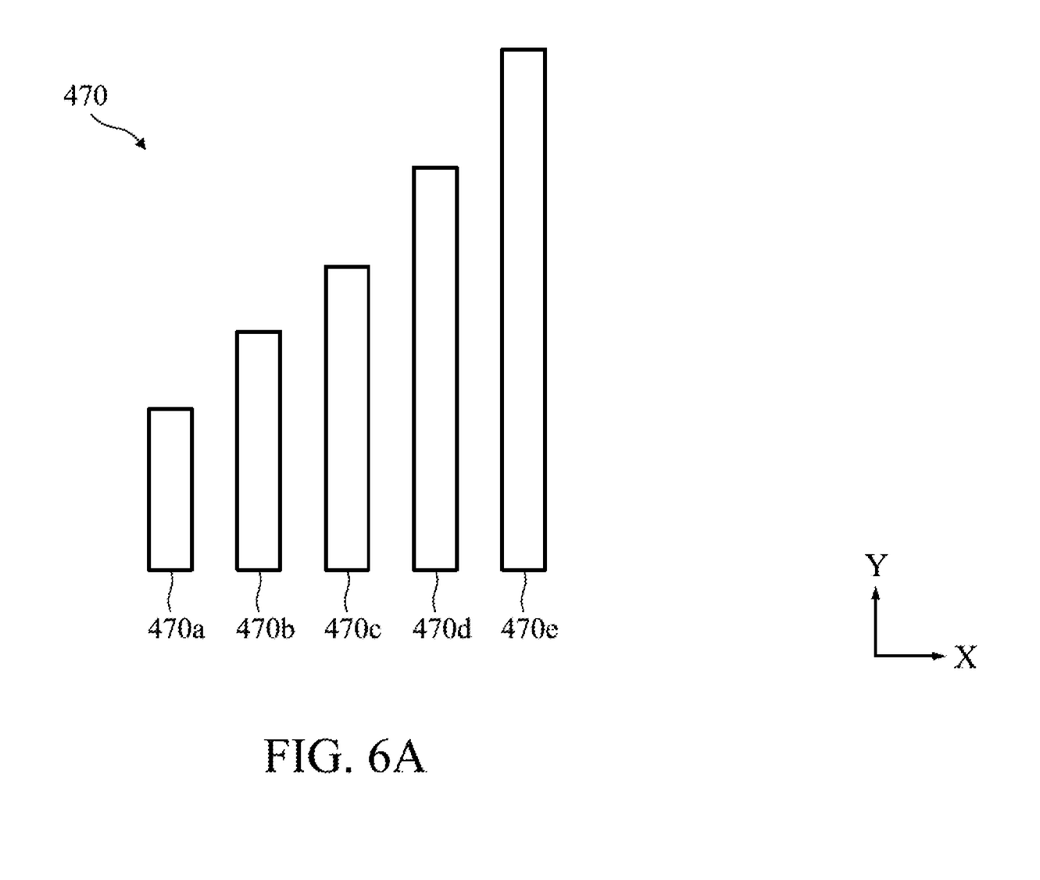
FIGS. 6A-6C are top plan views of the patterns in accordance with some embodiments of the present disclosure.
Figure 6B:
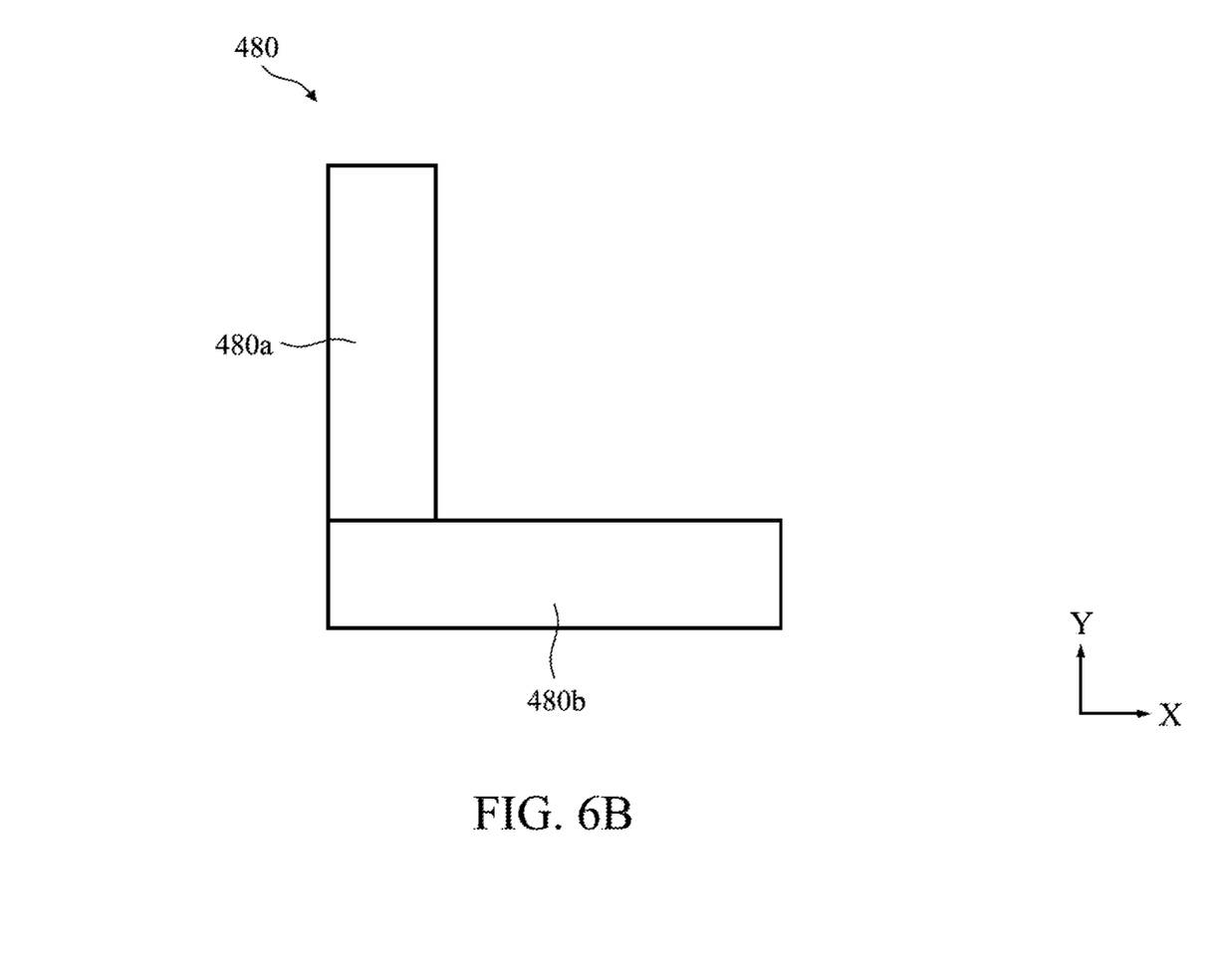
Figure 6C:
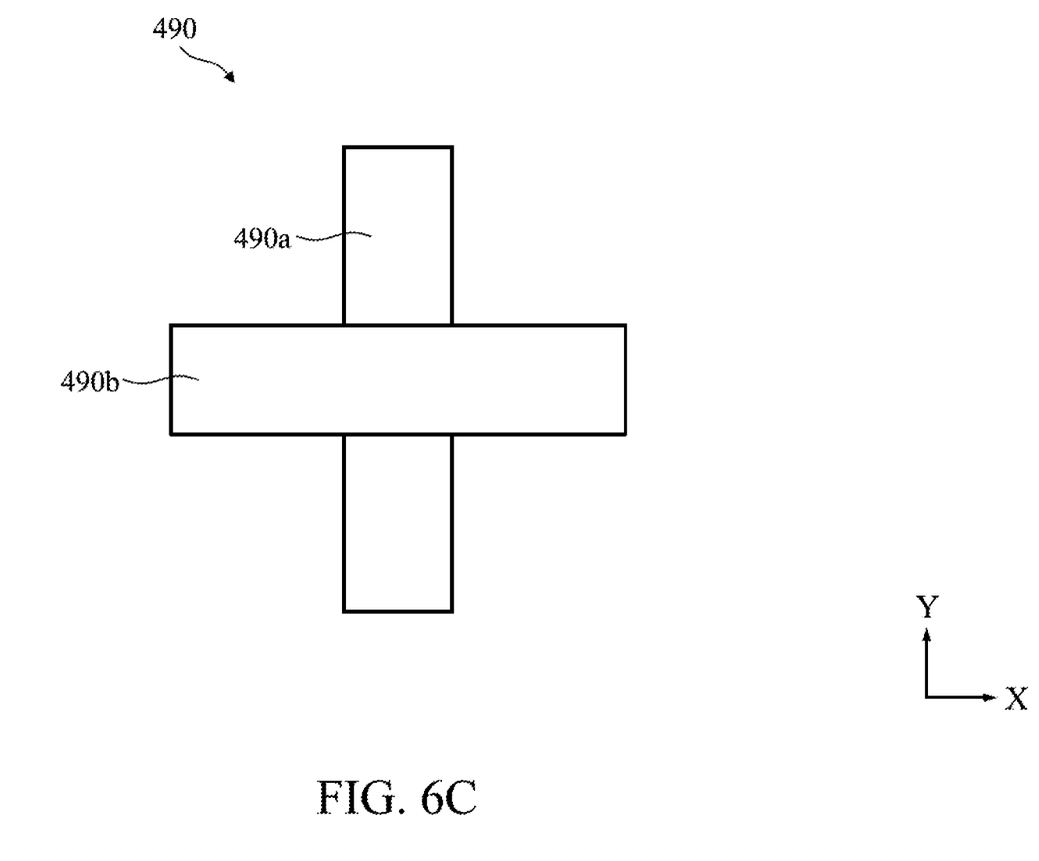

FIGS. 6A-6C are top plan views of patterns 470, 480, and 490 in accordance with some embodiments of the present disclosure. It should be appreciated that these patterns 470, 480, and 490 may also be formed in the redundant regions 400s. For example, in some embodiments, the patterns 470, 480, and 490 may be disposed along with the patterns 460 and the electrical circuit 450. In some embodiments, the patterns 460 and/or the electrical circuit 450 may be replaced with either of the patterns 470, 480, and 490. As shown in FIG. 6A, a pattern 470 includes a plurality of strips 470a, 470b, 470c, 470d, and 470e that arranged parallel to each other, and the lengths of the strips 470a, 470b, 470c, 470d, and 470e are different from each other. A measurement may be conducted to measure each length of the strips 470a, 470b, 470c, 470d, and 470e. For example, the result of the measurement may help to determine if there is a deviation of the dimensions of the semiconductor structure 100.

As shown in FIG. 6B, a pattern 480 includes a first section 480a and a second section 480b that is disposed adjacent to the first section 480a. To be more specific, the first section 480a and the second section 480b constitute an L-shaped structure. As shown in FIG. 6C, a pattern 490 includes a first section 490a and a second section 490b that is disposed to intersect with the first section 490a. To be more specific, the first section 490a and the second section 490b constitute a cross structure. In some embodiments, the patterns 480 and 490 may help to position or align different layers or masks during the manufacturing processes of the semiconductor structure 100. For example, the identical patterns may be formed on two different layers or masks. Once the patterns vertically overlap, it may be determined that the two different layers or masks are substantially aligned, so as to reduce the dimension error during the manufacturing processes.

Figure 7:
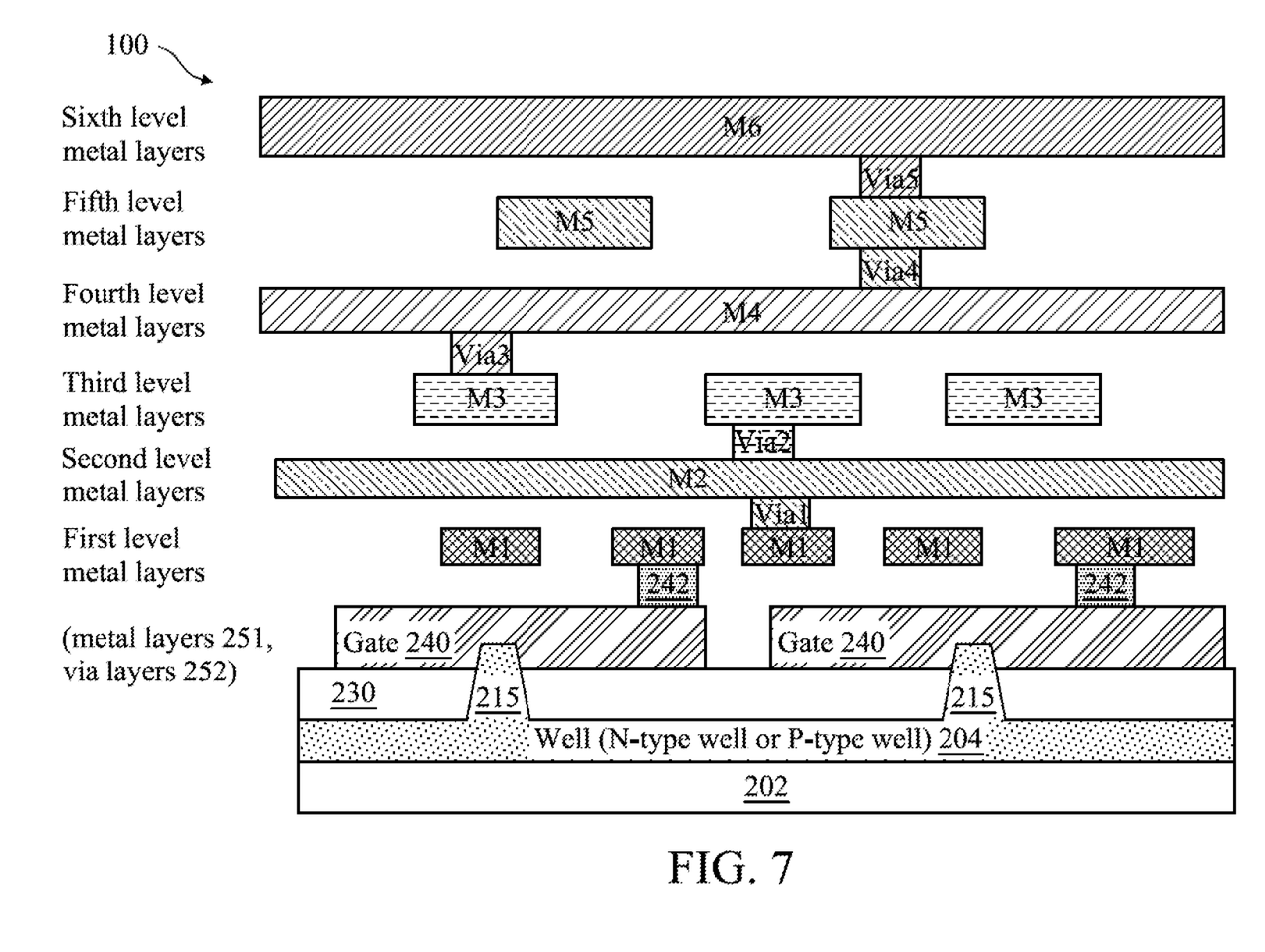
FIG. 7 shows a cross-sectional view of various layers of the semiconductor structure shown in FIGS. 1A and 2, in accordance with some embodiments of the present disclosure.

FIG. 7 shows a cross-sectional view of the semiconductor structure 100, illustrating various layers therein including wells (or diffusion layer) 204, isolation structure 230, fin layer 215, gate layer 240, gate via layer 242, contact layer (not shown, but at the same level as the gate layer 240), contact via (or via0) layer (not shown, but at the same level as the gate via layer 242), the first through sixth metal (M1, M2, M3, M4, M5, and M6) layers 251, and the first through fifth via (via1, via2, via3, via4, and via5) layers 252. The semiconductor structure 100 may include other layers or features not shown in FIG. 7.

In some embodiments, the wells 204 are formed in or on the substrate 202 in the circuit regions 150. The wells 204 include p-type doped regions configured for n-type transistors, and n-type doped regions configured for p-type transistors. The fin layer 215 includes fin-shaped semiconductor material(s) (or fins) protruding from the substrate 202. In some embodiments, the fins for NMOSFET include single crystalline silicon or intrinsic silicon or another suitable semiconductor material; and the fins for PMOSFET may comprise silicon, germanium, silicon germanium, or another suitable semiconductor material. In some embodiments, the electrical circuits 450 and/or the patterns 460, 470, 480, 490 are formed in the fin layer, in the form of semiconductor fins, although they may or may not form functional transistors. The isolation structure 230 has been discussed earlier and isolates the fins.

The gate layer 240 includes gate structures having gate dielectric layer(s) and gate electrode layer(s). The gate dielectric layer(s) may include silicon dioxide, silicon oxynitride, and/or a high-k dielectric material such as $HfO_2$, $HfSiO$, $HfSiO_4$, $HfSiON$, $HfLaO$, $HfTaO$, $HfTiO$, $HfZrO$, $HfAlOx$, $ZrO$, $ZrO_2$, $ZrSi_{O2}$, $AlO$, $AlSiO$, $Al_2O_3$, $TiO$, $TiO_2$, $LaO$, $LaSiO$, $Ta_2O_3$, $Ta_2O_5$, $Y_2O_3$, $SrTiO_3$, $BaZrO$, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (in which the k value is substantially equal to 3.9). The gate electrode layer(s) may include titanium, aluminum, tantalum carbide, tantalum carbide nitride, tantalum silicon nitride, titanium nitride, tantalum nitride, ruthenium, molybdenum, tungsten, platinum, tungsten, cobalt, copper, and/or other suitable materials. In some embodiments, the electrical circuits 450 and/or the patterns 460, 470, 480, 490 are also formed in the gate layer, in the form of gate dielectric layer(s) and gate electrode layer(s), although they may or may not form functional transistor gates.

Each of the gate via layer 242, contact layer (not shown), contact via layer (not shown), the via layers 252, and the metal layers 251 may include titanium, tantalum, tungsten, cobalt, molybdenum, ruthenium, or a conductive nitride such as titanium nitride, titanium aluminum nitride, tungsten nitride, tantalum nitride, or combinations thereof, and may be formed by CVD, PVD, ALD, and/or other suitable processes. In some embodiments, the electrical circuits 450 and/or the patterns 460, 470, 480, 490 are also formed in each of the layers mentioned above and using the same material and process that form the corresponding features in the circuit regions 150.

Although not intended to be limiting, embodiments of the present disclosure provide one or more of the following advantages. For example, embodiments of the present disclosure provide a semiconductor structure with a dual seal ring structure. The dual seal ring structure includes an outer seal ring enclosing two or more inner seal rings. Each inner seal ring encloses a circuit region. The semiconductor structure can be used to form connected dies or individual dies. The outer seal ring provides the sealing and protective function to the connected dies. The inner seal rings provide the sealing and protective function to the individual dies. The outer seal ring and the inner seal rings have the same structure (both with interior corner seal ring structures) which is robust against stress during dicing. Redundant regions between the outer seal ring and the inner seal rings are filled with electrical circuit or functional patterns to reduce manufacturing process deviation and to enhance the performance of the semiconductor structure. Further, in some embodiments, multiple (such as four) sub seal rings are formed in the outer seal ring and the inner seal rings to further improve the seal rings' operational reliability. Embodiments of the present disclosure can be readily integrated into existing semiconductor manufacturing processes.

In some embodiments, the semiconductor structure includes two circuit regions, two inner seal rings, an outer seal ring, a first redundant region, and an electrical circuit. Each of the inner seal rings surrounding one of the circuit regions. The outer seal ring is disposed around the inner seal rings, and each of the inner seal rings contacts the outer seal ring at different interior corners of the outer seal ring. The first redundant region is located between at least one of the inner seal rings and the outer seal ring. The electrical circuit is formed in the first redundant region and electrically connected to at least one of the circuit regions.

In some embodiments, the semiconductor structure includes two circuit regions, two inner seal rings, an outer seal ring, a first redundant region, and a pattern. Each of the inner seal rings surrounding one of the circuit regions. The outer seal ring is disposed around the inner seal rings, and each of the inner seal rings contacts the outer seal ring at different interior corners of the outer seal ring. The first redundant region is located between at least one of the inner seal rings and the outer seal ring. The pattern is formed in the first redundant region, and the distribution density of the pattern in the first redundant region is non-uniform across the first redundant region.

In some embodiments, a method for forming a semiconductor structure, including: forming two circuit regions; forming two inner seal rings, each of the inner seal rings surrounding one of the circuit regions; forming an outer seal ring surrounding the inner seal rings, wherein each of the inner seal rings contacts the outer seal ring at different interior corners of the outer seal ring, wherein a first redundant region is formed between at least one of the inner seal rings and the outer seal ring; and forming an electrical circuit formed in the first redundant region and electrically connected to at least one of the circuit regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
two circuit regions;
two inner seal rings, each of the inner seal rings surrounding one of the circuit regions;
an outer seal ring disposed around the inner seal rings, wherein each of the inner seal rings contacts the outer seal ring at different interior corners of the outer seal ring;
a first redundant region located between at least one of the inner seal rings and the outer seal ring; and
an electrical circuit formed in the first redundant region and electrically connected to at least one of the circuit regions.

2. The semiconductor structure of claim 1, further comprising:
a second redundant region located between an edge of each of the inner seal rings, wherein the edges are opposite to and substantially parallel to each other.

3. The semiconductor structure of claim 2, wherein the semiconductor structure is configured to be diced along a scribe line in the second redundant region and through the outer seal ring.

4. The semiconductor structure of claim 1, wherein each of the inner seal rings has an opening, the openings are substantially aligned with each other, and the semiconductor structure further comprises:
interconnects that go through the openings and electrically connect the circuit regions.

5. The semiconductor structure of claim 4, wherein the semiconductor structure is configured to be diced along an area that is outside of the outer seal ring.

6. The semiconductor structure of claim 1, wherein the electrical circuit is formed in each layer of the semiconductor structure in which vertically protruding circuit features are present at the circuit regions.

7. The semiconductor structure of claim 1, further comprising a pattern formed in the first redundant region, wherein the electrical circuit and the pattern are formed on different sides of the first redundant region.

8. The semiconductor structure of claim 1, wherein the electrical circuit located at two vertically adjacent layers of the semiconductor structure is vertically connected.

9. A semiconductor structure, comprising:
two circuit regions;
two inner seal rings, each of the inner seal rings surrounding one of the circuit regions;
an outer seal ring disposed around the inner seal rings, wherein each of the inner seal rings contacts the outer seal ring at different interior corners of the outer seal ring;

a first redundant region located between at least one of the inner seal rings and the outer seal ring; and a pattern formed in the first redundant region, wherein the distribution density of the pattern in the first redundant region is non-uniform across the first redundant region.

10. The semiconductor structure of claim 9, wherein the pattern comprises an electrical circuit electrically connected to at least one of the circuit regions.

11. The semiconductor structure of claim 9, wherein the pattern comprises homocentric squares, an L-shaped structure, or a cross structure.

12. The semiconductor structure of claim 9, wherein the pattern comprises a plurality of strips arranged parallel to each other, and the lengths of the strips are different.

13. The semiconductor structure of claim 9, wherein the pattern is present at least in one of a fin layer, a gate layer, a contact layer, via layers, and metal layers of the semiconductor structure.

14. The semiconductor structure of claim 9, further comprising:

a second redundant region located between an edge of each of the inner seal rings, wherein the edges are opposite to and substantially parallel to each other.

15. The semiconductor structure of claim 14, wherein the pattern is formed in the first redundant region and the second redundant region, wherein the distribution density of the pattern in the second redundant region is non-uniform across the second redundant region.

16. A semiconductor structure, comprising:

two circuit regions;

two inner seal rings, each of the inner seal rings surrounding one of the circuit regions;

an outer seal ring disposed around the inner seal rings, wherein the outer seal ring comprises four corner seal ring (CSR) structures in contact with either of the inner seal rings;

a first redundant region and a second redundant region separated by one of the CSR structures and one of the inner seal rings; and two electrical circuits each formed in the first redundant region and the second redundant region and electrically connected to at least one of the circuit regions.

17. The semiconductor structure as claimed in claim 16, wherein the inner seal rings are formed with a plurality of openings, and the openings are away from the first redundant region and the second redundant region.

18. The semiconductor structure as claimed in claim 17, further comprising:

a plurality of interconnects connecting the circuit regions through the openings.

19. The semiconductor structure as claimed in claim 16, wherein the outer seal ring comprises a plurality of sub seal rings, and the sub seal rings and the electrical circuits are disposed on the same level.

20. The semiconductor structure as claimed in claim 19, wherein one of the sub seal rings is wider than another of the sub seal rings.

* * * * *